United States Patent [19]

Nadkarni et al.

[11] Patent Number: 4,999,336

[45] **Date of Patent: * Mar. 12, 1991**

[54] DISPERSION STRENGTHENED METAL COMPOSITES

[75] Inventors: Anil Nadkarni, Mentor; Prasan K. Samal, Pepper Pike, both of Ohio; James E. Synk, New York, N.Y.

[73] Assignee: SCM Metal Products, Inc., Cleveland, Ohio

[ * ] Notice: The portion of the term of this patent subsequent to Apr. 3, 2001 has been disclaimed.

[21] Appl. No.: 208,377

[22] Filed: Jun. 17, 1988

Related U.S. Application Data

[63] Continuation-in-part of Ser. No. 561,035, Dec. 13, 1983, Pat. No. 4,752,334.

[51] Int. Cl.[5] ........................ H01L 39/12; H01L 5/08; H01L 39/24

[52] U.S. Cl. .......................................... 505/1; 75/252; 75/255; 75/229; 75/232; 75/233; 75/234; 75/235; 75/240; 75/244

[58] Field of Search ........................ 75/235, , 229, 232, 75/244, 234, 233, 240; 505/252, 255, 1

[56] References Cited

U.S. PATENT DOCUMENTS 4,752,334 6/1988 Nadkarni et al. .................... 75/235

*Primary Examiner*—Stephen J. Lechert, Jr.
*Attorney, Agent, or Firm*—Lieberman Rudolph & Nowak

[57] ABSTRACT

There is provided a substantially fully dense powdered metal composite comprising a highly conductive metal or metal alloy matrix having dispersed therein discrete microparticles of a refractory metal oxide and discrete macroparticles of a mechanical or physical property-conferring additive material. The respective components undergo minimal alloying or interdispersion because sintering is not utilized in forming the composite. These composites are characterized by high thermal or electrical conductivity and a desired property (controlled thermal expansion, high strength, wear and arc erosion resistance, or magnetic) attributable to the composite forming material, like refractory metal, alloy, or compound. The composites are useful in forming lead frames for integrated circuit chips, electric lamp lead wires, electrical contact members, and discrete component leads.

53 Claims, 7 Drawing Sheets

DISPERSION STRENGTHENED METAL COMPOSITES

This application is a continuation-in-part of Ser. No. 561,035, filed Dec. 13, 1983, U.S. Pat. No. 4,752,334.

This invention is in the field of powder metallurgy and relates to metal composites in which one of the metallic ingredients is a preformed dispersion strengthened metal, e.g., dispersion strengthened copper, and a second is a different material capable of conferring desired mechanical or physical properties to the composite. The composites of the invention are critically unsintered consolidates produced by processing steps such as pressing, extrusion, swaging or rolling (or combinations thereof), and can take a variety of shapes such as billets, strips, rods, tubes or wires. These composites can be fabricated to have a wide range of mechanical properties including strength, hardness, wear and arc erosion resistance while simultaneously possession useful physical properties including high conductivity, low thermal expansion, magnetic properties etc., heretofore unknown to conventional composite systems.

BACKGROUND OF THE INVENTION AND PRIOR ART

This invention has for its principal objective the provision of a composite that has relatively good electrical and thermal conductivity, and, for example, a low coefficient of thermal expansion, high hardness, high wear resistance, particular magnetic properties, and/or other properties or characteristics desired. Without limiting the scope of this invention, one way to achieve these objectives is by blending powders and compacting to substantially full density, principally (but not exclusively) by hot isostatic pressing ("HIPing") and/or hot extrusion without sintering, the following two components:

(a) a preformed dispersion strengthened metal provided typically as a powder (before blending with component (b)) and including, e.g., dispersion strengthened copper, silver, or aluminum, desirably having an electrical resistivity below $8\times10^{-6}$ ohm-cm, and (b) an additive material consisting for example of metals such as chromium and titanium and alloys of these metals, or refractory metals, alloys and compounds having one or more refractory metals as the major constituent.

"Additive material", as used herein, generally refers to metals, alloys or compounds having one or more desirable physical or mechanical characteristics, including high density, high melting point, low coefficient of expansion, and superior resistance to wear, arc erosion and acid corrosion, and include, but are not limited to molybdenum, tungsten, titanium, niobium, tantalum, rhenium, and chromium as well as alloys such as nickel with iron, nickel with iron and cobalt, iron-nickel alloys containing for example from about 30–55% nickel by weight plus minor additives such as manganese, silicon and carbon, samarium/cobalt, chromium with molybdenum, beryllium-copper, various steels (including maraging, stainless and music wire), and various combinations of two or more suitable alloying metals (including tin, zinc, tin/zinc mixtures, silicon, magnesium, beryllium, zirconium, silver, chromium, iron, nickel, phosphorus, titanium and samarium). Also included are alloys and compounds of refractory metals such as tungsten-rhenium, tungsten-nickel-iron, tungsten-carbide etc. Superconducting materials, for example niobium-tin, niobium-titanium and copper-barium-yttrium oxide can be added to the dispersion strengthened metal (i.e. copper) to form a composite wherein the DSC acts as a stabilizer for the superconducting materials.

Dispersion strengthened metals are well known. Reference may be had to U.S. Pat. No. 3,779,714 to Nadkarni, et al., and the references discussed in the text thereof, all incorporated herein by reference, for examples of dispersion strengthened metals, especially copper, and methods of making dispersion strengthened metals. In Nadkarni, et al., dispersion strengthened copper (hereinafter called "DSC") is produced by forming an alloy of copper as a matrix metal and aluminum as a refractory metal oxide forming, solute metal. This alloy, containing from 0.01% to 5% by weight of the solute metal, is comminuted by atomization (See U.S. Pat. No. 4,170,466), or by conventional size reduction methods to a particle size, desirably less than about 300 microns, preferably from 5 to 100 microns, then mixed with an oxidant. The resultant alloy powder-oxidant mixture is then compacted prior to heat treatment, or heated to a temperature sufficient to decompose the oxidant to yield oxygen which internally oxidizes the solute metal to the solute metal oxide in situ, thereby providing a very fine and uniform dispersion of refractory metal oxide, e.g., alumina, throughout the matrix metal. Thereafter, the preformed dispersion strengthened metal is collected as a powder or submitted to size reduction to yield a powder having a particle size of from −20 mesh to submicron size for use herein. Alternatives, such as mechanical alloying of the matrix and solute metals as by prolonged ball milling of a powder mixture for 40 to 100 hours can also be used prior to internal oxidation.

Dispersion strengthening can be accomplished in a sealed can or container (U.S. Pat. No. 3,884,676). The alloy powder may be recrystallized prior to dispersion strengthening (U.S. Pat. Nos. 3,893,844 and 4,077,816). Other processes are disclosed in U.S. Pat. Nos. 4,274,873; 4,315,770 and 4,315,777 at Col. 6, lines 5–16). The disclosures of all of the foregoing U.S. Patents are incorporated herein by reference; these patents are commonly owned with the present application.

Certain other composites of metal powders seeking low thermal expansion characteristics and low resistivity are known. U.S. Pat. No. 4,158,719 to Frantz discloses a composite made by compacting a mixture of two powders, one of which has low coefficient of thermal expansivity and the other of which has high thermal conductivity. The composite is useful, like the products of the present invention, in the production of lead frames for integrated circuit chips. Frantz's composite is made by mixing the powders, forming into a green compact, and, in distinction from the present invention, sintering and then rolling to size. Frantz discloses a low thermal expansivity alloy containing 45 to 70% iron, 20–55% nickel, up to 25% cobalt and up to 5% chromium, which in powder form is mixed with a high thermal conductivity metal powder of substantially elemental iron, copper, or nickel. However, none of the metals disclosed by Frantz is dispersion strengthened. In addition, the pressing-sintering and rolling to size taught by Frantz does not work with dispersion strengthened copper composite.

U.S. Pat. No. 4,501,941 to Cherry discloses a process for making a vacuum interrupter electrical contact by admixing a copper powder which is dispersed with finely divided aluminum oxide and chromium powders, cold pressing the admixed powders at high pressure to form a compact of high intermediate density, (for example pressing the admixed powders into the required shape in a die at about 60 tons/square inch) and then sintering the compact at a temperature below the melting point of copper (col.3, lines 1-5). Cherry discloses that the additive metal minor portion of the compact is preferably chromium, but refractory metals such as tungsten or tungsten carbide can be utilized. As shown in our comparative examples below however, cold pressing causes laminations. In addition, the strength of sintered compacts is very poor in the case of dispersion strengthened copper composites made by this process. The instant invention overcomes problems of the Cherry processes and products, such as marked laminations (surface cracks) and weaknesses. These imply poor green strength, and render the product unsuited for many uses, such as for example, as an electrical contact material (see comparative examples below).

Critical to the present invention, we have found that not only does the use of dispersion strengthened materials give rise to a stronger, harder product, but, hot isostatically pressing or hot extruding at significantly lower temperatures for example, 1750° F. and 1650° F. respectively, compared to Cherry's temperature of 1920° F., together with the other controlled parameters herein, a product substantially devoid of laminations, while simultaneously possessing improved hardness and higher conductivity, can be formed. The superior strength inhot isostatically pressed material arises from acheiving substantially full density. The sintering step taught by Cherry, at high temperatures such as 1920° F. causes more diffusion of additive metal atoms into copper thus reducing conductivity. The instant invention which uses hot extrusion or hot isostatic pressing keeps the temperature below this temperature reducing such diffusion.

Nickel/iron alloys that contain 36% Ni, balance Fe with Mn, Si and C totalling less than 1%, are known as "Nilvar" or "Alloy 36". Nickel/iron alloys that contain 42% Ni, balance Fe with Mn, Si and C totalling less than 1%, are members of a family of nickel/iron alloys known as "Invar" or "Alloy 42". Nickel/iron alloys that contain 46% Ni, balance Fe with Mn, Si and C totalling less than 1%, are known as "Alloy 46". Similarly, "Alloys 50" and "52" comprise 50% Ni and 52% Ni, respectively, with the balance being substantially Fe.

The respective properties of the sintered composites of the prior art and the unsintered composites of the present invention have been studied, and one of the improvements of the instant invention (a composite having both high hardness and high conductivity) is thereby made apparent. Other characteristics can be obtained in a composite by following the teachings herein without deviating from the spirit of the invention.

A composite strip and wire were made with DSC and copper and each of (1) 36% Ni/64% Fe (Nilvar) and (2) 42% Ni/58% Fe (Invar) and the respective procedures were followed for forming the composites. Those composites made with DSC and the Invar alloys have high strength and good strength retention after exposure to high temperatures. The prior art material iron with Nilvar, alloy (1), and iron with Invar, alloy (2), show higher strength than copper metal with alloys (1) or (2), but this is only with the sacrifice of electrical conductivity.

To obtain high strength with copper composites, the prior art has had to use fine powder which reduces conductivity significantly. On the other hand, coarse copper powder yields high conductivity but lower strength.

Another example of the prior art, U.S. Pat. No. 4,366,065 to Bergmann, et al., discloses the preparation of a composite material by powder metallurgy wherein a starting material (comprised of at least one body-centered cubic metal contaminated by oxygen in its bulk and on its surface) is mixed with a less noble supplemental component that has a greater binding enthalpy for oxygen in powder form, or as an alloy whereby the oxygen contaminant becomes bound to the supplemental component (aluminum) by internal solid state reduction. The composite is then deformed in at least one dimension to form ribbons or fibers thereof. Niobium-copper is exemplified with aluminum as the oxygen getter.

A principal advantage of using DSC as opposed to using plain copper (like Bergmann, et al.) appears to be that DSC enables closer matching of stresses required for deformation of the two major components. Because of closer matching, the powder blends and composites can be co-extruded, hot forged, cold or hot rolled and cold or hot swaged. When one of the components undergoing such working is excessively harder, for example, than the other, then the particles of the harder component remain undeformed. The flow of softer material over and around the harder particles generally leads t the formation of voids and cracks, and hence weakness in the structure. The greater strength of the DSC material over the unmodified or plain copper enables closer matching with the additive metal as, for example, with respect to yield strength, and the size and shape of the regions occupied by the individual components will be more nearly alike. Closer matching of forming stresses enables achievement of full density for the powder blend in one hot forming operation, such as extrusion, or multiple size reduction steps such as swaging or rolling. This, we have found, eliminates much of the need for sintering.

The prior art universally utilizes sintering (typically two steps) at very high temperatures (1850° F. for copper and 2300° F. for iron or 1920° F., as in Cherry). These temperatures promote inter-diffusion of atoms of the two components or alloying to occur, which we have found to be disadvantageous to the desired characteristics of the composite. Diffusion of iron and/or nickel or other metals into copper lowers the electrical conductivity of the copper and conversely, diffusion of copper into the additive metal adversely effects its coefficient of thermal expansion. The prior art is devoid of effective solutions: to obtain a composite with both high hardness and high conductivity.

In carrying out the present invention the temperatures utilized are below sintering temperature used in prior art procedures and, we have found that, as a result, inter-diffusion of atoms, or alloying, between the principal components is reduced. From the prior art it can be seen that when sintering time is increased from 3 minutes to 60 minutes, the electrical resistivity actually increases significantly from 35 up to 98 microhm-cm. (See examples 4 and 6 and examples 5 and 7 in U.S. Pat. No. 4,158,719). Stated in another way, electrical conductivity, the goal, decreases significantly. This variation in resistivity or conductivity, believed to be due to interdiffusion of copper and nickel (for example, from Invar alloy 42), is a serious problem. Use of DSC instead of copper or a copper alloy, while controlling the temperature below sintering, retards such inter-diffusion because the dispersed refractory oxide, e.g., $Al_2O_3$ acts as a barrier to or inhibitor of diffusion. DSC (AL 15) has an electrical conductivity of 90–92% IACS and an annealed yield strength of 50,000 psi.

Other patent references of interest, yet distinguishable from the instant invention, include U.S. Pat. No. 2,853,401 to Mackiw, et al. which discloses chemically precipitating a D.S. metal onto the surface of fine particles of a carbide, boride, nitride or silicide of a refractory hard metal to form a composite powder and then compacting the powder. U.S. Pat. No. 4,032,301 to Hassler discloses a contact material for vacuum switches formed of mixed powders of a high electrical conductivity metal, e.g., copper, and a high melting point metal, e.g., chromium, compacted, that are then sintered. U.S. Pat. No. 4,139,378 to Bantowski is concerned with brass powder and compacts improved by including a minor amount of cobalt. The compacts are sintered. U.S. Pat. No. 4,198,234 Cadle et al. discloses mixing a pre-alloy powder of chromium, iron, silicon, boron, carbon and nickel at least about 60%, and copper powder, compacting the blend and liquid phase sintering at 1920° F. to 2010° F. to partly dissolve the copper and nickel alloy in one another.

The present invention is distinguished from the prior art particularly in that the unsintered composite product is made by compacting a preformed dispersion strengthened metal, e.g., DSC, dispersion strengthened aluminum or dispersion strengthened silver, together with an additive metal, alloy and/or compound. The product of this invention, in addition to having relatively high electrical conductivity, has improved mechanical properties not possessed by the prior art composites, because we have found the materials are critically compacted to substantially full density without a sintering step.

BRIEF STATEMENT OF THE INVENTION

Briefly stated, the present invention is in a substantially fully dense composite comprising a metal matrix having dispersed therein discrete microparticles of a refractory metal oxide and macroparticles of an additive material such as a different metal or metal alloy, a refractory metal, refractory metal alloy or refractory metal compound.

The products hereof are characterized by good electrical and thermal conductivity plus another mechanical or physical property characteristic of the additive metal or metal alloy, for example, a low coefficient of thermal expansion. Those products having low coefficient of thermal expansion are especially useful in fabricating lead frames for semiconductors and integrated circuits, as well as in lead wires in electric lamps. Other composites include those characterized by high strength, high wear and arc erosion resistance or magnetic properties. The invention also contemplates a method for producing such composites characterized by densifying a blend of (a) a dispersion strengthened metal powder and (b) a powdered refractory metal, alloy, or compound at a temperature low enough to minimize alloying and inter-diffusion between (a) and (b).

BRIEF DESCRIPTION OF THE DRAWINGS

The annexed photographs or photomicrographs are included for better understanding and illustration of the embodiments of the invention, or comparison of the invention results with prior art results, and are not to be construed as limiting the scope of the invention, wherein.

DETAILED DESCRIPTION OF THE INVENTION

Figure 1:
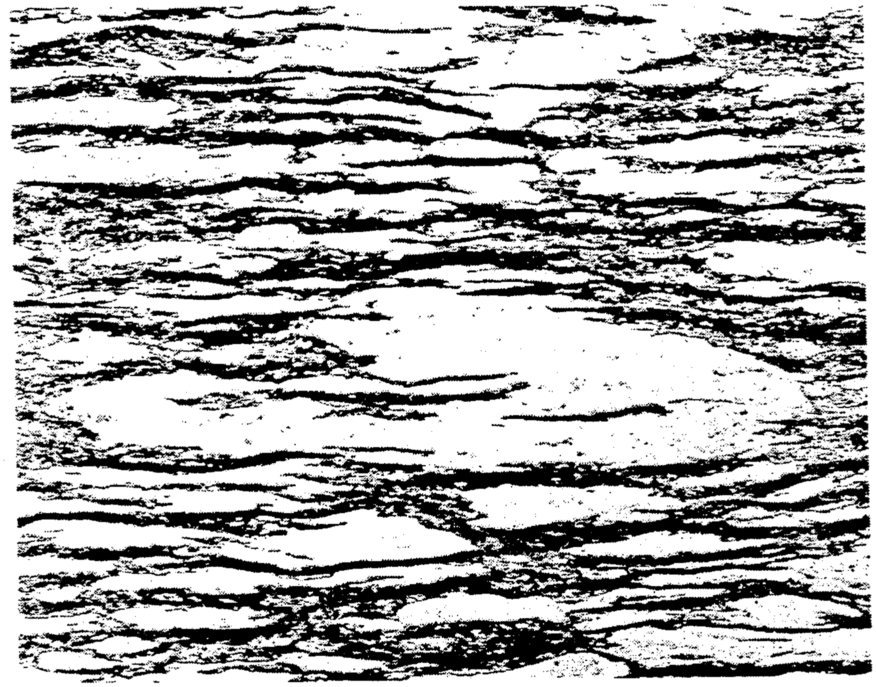
FIG. 1 is a photomicrograph of a section showing a plain copper/Nilvar 50:50 blend treated according to Example IX below.

As indicated above, there are two principal constituents of the composite metal systems hereof. These are (a) a high conductivity dispersion strengthened metal having discrete microparticles, i.e., smaller than 0.1 micron, of a refractory metal oxide uniformly dispersed throughout the body of a matrix metal and desirably formed by an internal oxidation process, such as described in U.S. Pat. No. 3,799,714 described above; and (b) discrete macroparticles, i.e., larger than 1 micron of an additive material, for example a metal, metal alloy, or refractory metal, alloy or compound. For convenience, the invention will be discussed in detail with reference to (a) dispersion strengthened copper containing uniformly dispersed therein microparticles of aluminum oxide and prepared by internal oxidation of the aluminum from an alloy of aluminum and copper; and (b) a low coefficient of expansion nickel/iron alloy, e.g., Invar. It will be understood, however that a low coefficient of expansion is just one property of interest, the others include but are not limited to wear and arc erosion resistance and magnetic properties. Principles of the invention are applicable in the same manner to other dispersion strengthened metals for example, dispersion strengthened silver, aluminum, etc., copper alloys such as brass, bronze, etc., and to other metals, metal alloys or intermetallic compounds having a low coefficient of expansion. The term "alloy" as used herein will be understood as including intermetallic compounds.

"GlidCop" (a registered trademark of SCM Corporation) DSC is made in powder form in several different grades consisting of a copper matrix having a dispersion of submicroscopic particles of $Al_2O_3$; with the amount of $Al_2O_3$ being 0.3% (AL-15), 0.4% (AL-20), 0.7% (AL-35), and 1.1% (AL-60), by weight. The equivalent aluminum content is from 0.15 to 0.6%. These materials have Copper Development Association (CDA) numbers C15715, C15720, C15735 and C15960, respectively. The refractory metal oxide is very uniformly dispersed by virtue of internal oxidation of a solute metal, e.g., aluminum, alloyed in the copper metal. The aluminum oxide particles resulting from internal oxidation are discrete and have a size less than 0.1 microns and generally of the order of about 100 Angstroms; hence, "microparticles".

Invar-type alloys are a family of alloys of iron and nickel, with nickel content ranging from 30% to 55%, by weight and with minor additives or impurities such as manganese, silicon and carbon, not exceeding 1% by weight, the balance being iron. Kovar alloys are similar to the Invar alloys except that part or all of the nickel is replaced with cobalt, a typical example being 28% Ni, 18% Co, balance is substantially Fe. Other additive materials, such as molybdenum, tungsten, titanium, niobium, etc., or alloys of cobalt and iron, nickel and chromium, nickel and molybdenum, chromium and molybdenum or metal compounds (e.g. tungsten or titanium carbide), may be used as well in carrying out the present invention. The additive materials desirably have a particle size in the range of about 5 to 300 microns; hence, "macroparticles".

D.S. Coppers possess high tensile strength, yield strength and moderate ductility, along with high electrical conductivity and thermal conductivity. D.S. Coppers retain their strength very well after exposure to high temperatures (such as in the range of 1400° F. to 1800° F.), a property not found in any other high conductivity copper alloys. Table 1 below lists properties of commercial DSC. It may be noted here that DSC is generally produced by powder metallurgy technology.

In general, the relative proportions of (a) and (b) will be dictated by the ultimate desired properties of the composite.

TABLE 1

| | COMPARATIVE PROPERTIES OF GLIDCOP AND ALLOY 42 | | | |
|---|---|---|---|---|
| PROPERTY | UNIT | GLIDCOP AL 20 | GLIDCOP AL 60 | ALLOY 42 |
| Chemical Composition | Weight % | Cu + .4% $Al_2O_3$ | Cu + 1.1% $Al_2O_3$ | 42% Ni, 0.34% Mn 0.01% C., Bal. Fe |
| Density | gm/cc | 8.81 | 8.78 | 8.00 |
| Electrical Resistivity | at 20° C., Microhm-Cm | 1.94 | 2.21 | 80.00 |
| Electrical Conductivity | at 68° F., % IACS | 89 | 78 | 2 |
| Thermal Conductivity | at 20° C., cal/cm$^2$/cm/sec/°C. | 0.84 | 0.77 | 0.026 |
| Coefficient Of Thermal Expansion | $10^{-6}$/°C. cm/°C. | 19.6 | 20.4 | 5.2 |
| Tensile Strength | 1000 psi | 68-82 | 83-90 | 65-90 |
| Yield Strength | 1000 psi | 53-74 | 75-84 | 40-60 |
| Elongation | % | 10-21 | 10-14 | 6-40 |

Broadly we use components (a) and (b) in a weight ratio of 5:95 to 95:5 and most usefully in a weight ratio of from 25:75 to 75:25. Corresponding volume ratios may be used as well.

Invar type alloys, which are nickel/iron alloys, have low electrical and thermal conductivity, good room temperature mechanical strength and a particularly low coefficient of thermal expansion. Properties of the most commonly used grade of these alloys are shown in Table 1. These alloys are widely used as glass-to-metal or ceramic-to-metal seals due to their low thermal coefficient of expansion which matches well with that of glass and ceramic. These alloys are conventionally made by fusion metallurgy, although commercial powder metallurgy processes for making them in strip form exist.

As noted in Table 1, the electrical conductivity of Alloy 42 (another nickel/iron alloy containing 42% Ni) is quite low in comparison with copper and copper alloys. However, these alloys are used in the electronics industry as lead frames because of the need for matching their low coefficient of thermal expansion with that of silicon chips and with the ceramic package or encapsulation. The electronics industry also uses copper and copper alloys for the lead frame application, especially when epoxy encapsulations are permissible. Use of copper or copper alloy lead frames is beneficial due to the high electrical thermal conductivity of copper. However, copper, copper alloys, aluminum or silver, while relatively highly conductive, have a high coefficient of thermal expansion. The high thermal conductivity helps in rapid dissipation of heat from the electronic chips during their use. At present, selection of strip material for lead frame fabrication involves sacrifices in either the thermal (and electrical) conductivity, or in the matching of coefficient of thermal expansion with silicon and ceramic components. Some attempts have been made by other workers to develop a stainless steel/copper composite to arrive at optimum desired strength properties. So far these composites have not found much acceptance in the industry.

The present invention provides a means of achieving both high electrical (and thermal) conductivities and improved mechanical and/or physical properties, e.g., a low coefficient of thermal expansion, or high hardness, in a single material which is a composite of an additive material component and a dispersion strengthened metal component. The relative volume of each of the two components can be varied to obtain specific combination of the desired properties. Examples provided in this application show some of these properties.

A principal advantage of the present invention is that it provides the art with a means for utilizing copper, aluminum, silver, etc., and the relatively high electrical and/or thermal conductivity thereof in a system which nevertheless has good mechanical properties, e.g., strength, dimensional stability, etc. Usually the blending of such conductive metal with a foreign metal results in a severe loss of conductivity, thermal and/or electrical, because of diffusion of the foreign metal into the copper. In the present case, the presence of a very highly dispersed refractory metal oxide in a dispersion strengthened metal, while causing some reduction in conductivity, yields a stronger, unsintered, fully densified, conductive component which has its mechanical properties enhanced by a second metal or metal alloy component as a composite structure distinct from a highly alloyed or interdiffusion product of the two components.

For making the composite materials strips, at least two processes have been tried herein and found satisfactory. One of the two methods is powder metallurgy extrusion of a blend of an alloy powder and dispersion strengthened power, e.g., Invar type alloy and DSC. Extrusion can be effected by using a copper billet container. The billet container becomes a cladding on the composite material rod or strip extruded and is beneficial from the point of view of high electrical conductivity. The extruded strip can then be rolled to the desired gage.

Another satisfactory process is rolling of a flat billet container filled with a blend of the two powders. The billet container can be of copper, as in extrusion, if additional high electrical conductivity is considered beneficial. Examples covered herein are based on the foregoing processes for the strip product.

The present invention is directed also to composite materials, such as wires, whose principal constituents are additive materials , for example alloys such as nickel-iron, or metals such as niobium and DSC. The benefits of this combination are achievement of a low coefficient of thermal expansion, or dimensional stability or hardness, and high electrical conductivity and thermal conductivity. Optimum levels of these two properties can be obtained by proper selection of the relative amount of the two constituents for any given application. The desirability of such combination of properties is based again on the need for achieving hermetic seals with glass or ceramic components and at the same time the need for achieving higher electrical and thermal conductivities in one material.

The electronics industry would find the composites hereof useful, for example, in diode lead wires. Besides potential uses in various electronic components, such wires simplify the fabrication of incandescent light bulbs by replacing both the 'dumet' (42% Ni, bal. Fe) wire and the DSC lead wire segments.

At present, the lead wire system of a light bulb consists of three different wire segments. The portion of the lead wire that supports the tungsten filament is made of dispersion strengthened copper (or another high temperature copper alloy) wire. This wire is attached to the tungsten filament on one end and the other end is welded on to a 'dumet' wire segment. The dumet wire is essentially an Invar type alloy (42% Ni) wire with a coating (or plating) of copper. The dumet wire passes through the evacuation stem of the bulb where it makes a hermetic seal, and its other end is welded on to a plain copper wire segment which connects to the electrical terminals of the light bulb.

The requirements for these three wire segments are somewhat different from each other. The DSC lead wire is required to conduct the electric current to the filament and at the sam time retain its mechanical strength despite the high temperatures encountered in the stem pressing (glass to metal sealing) operation during manufacture and in the vicinity of the tungsten filament during use. The dumet wire segment permits the lead wire system to be hermetically sealed within the glass stem with a compatible coefficient of expansion, so as to retain the back filled inert gas in the light bulb and also to carry current satisfactorily. The copper wire segments connect the terminal to the dumet wire segments and are only required to be efficient conductors of electricity. The use of a single composite wire made of DSC and an Invar type alloy satisfies the requirements for all three segments of the lead wire system. A comparison of electrical resistance of the present composite lead wire system with that of the current commercial design is shown below. Substitution of the currently used segmented structure by a single composite wire formed as herein described eliminates the need for welding the dumet wire segment to a dispersion strengthened copper wire segment on one side, and copper wire on the other.

The use of DSC is preferred over other copper alloy wires, such as Cu-Zr, because DSC wire has adequate stiffness to enable elimination of molybdenum support wires for the tungsten filament. This can be embodied easily with the composite wire system of this invention since the strength and stiffness retention of composite wire are similar to those of DSC lead wires. By using a small amount of boron in the DSC, oxygen problems can be eliminated.

The processes for making the composite wire include extrusion of a round rod, followed by wire drawing, and swaging of a copper or nickel tube-filled with a blend of DS copper powder and Invar type powder followed by drawing.

Figure 2:
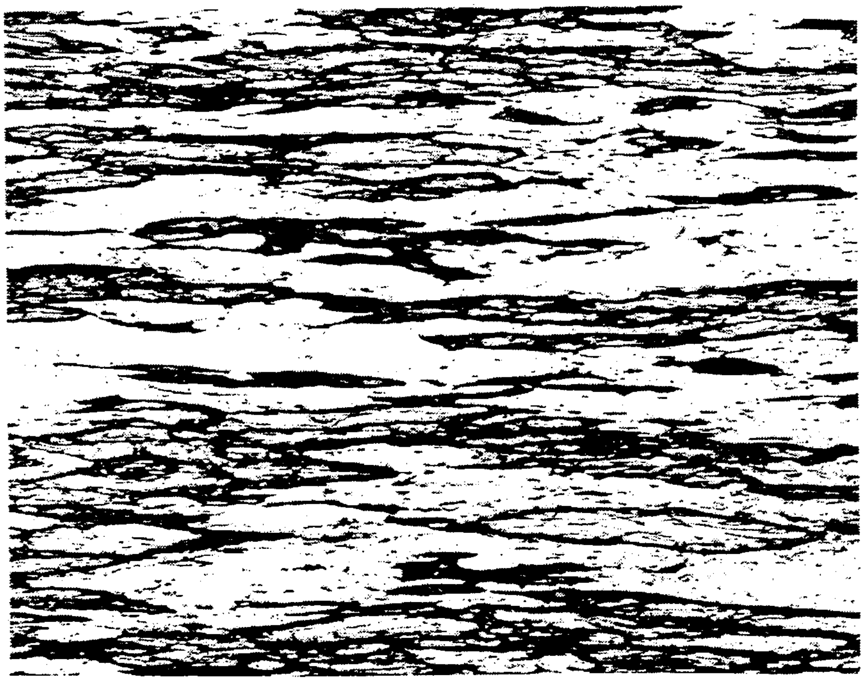
FIG. 2 is a photomicrograph of a section showing a dispersion strengthened copper/Nilvar 50:50 blend treated according to Example IX below.

As indicated above, FIGS. 1 and 2 are photomicrographs at the same magnification of a longitudinal section of a fully densified plain copper composite and a fully densified dispersion strengthened copper composite, respectively, all other factors being the same. The large particles in each figure (light gray) are Nilvar; the dark portions are the softer copper or DSC, respectively. Note the large central particle in FIG. 1. This is typical of the results when there is maximum disparity in the hardness of the ingredients, i.e., as in the case of plain copper and Nilvar. In the case of DSC, the relative hardnesses of the ingredients are closer together, and the photomicrograph of FIG. 2 is typical and shows a higher degree of interdispersion of the DSC with the Nilvar. It is clear that the interfacial surface area of the ingredients in FIG. 2 is much greater than in FIG. 1.

The opportunity for interfacial diffusion in the composite is thus much greater in the DSC composite than in the plain copper composite. As is known, the greater the extent of interdiffusion, the lower the conductivity. One expects, therefore, that the composite of FIG. 1 would have higher conductivity because of the lower opportunity for interfacial diffusion. Surprisingly, as is seen in Table 8 below, the conductivity of the DSC composites is better than the conductivity of the plain copper composites. The mechanical properties of the DSC composites are also superior to those of the plain copper composites.

The particles are in the main discrete. Interdiffusion can occur in both cases at the interface between the additive material and the copper or DSC, as the case may be. However, although one would expect higher interdiffusion in the case of the more finely subdivided dispersion strengthened metal composites because of the increased interfacial area and concomitant lower conductivity, this is not observed. The highly dispersed microparticulate refractory oxide resulting from internal oxidation acts as a barrier and inhibits interdiffusion or alloying whereby electrical conductivity is preserved, and at the same time the law of mixtures is allowed to function to a higher degree whereby the mechanical properties conferred by the additive metal, alloy or compound are preserved to a maximum extent. The relative extents of interdiffusion or alloying can be determined by Auger analysis.

Figure 4:
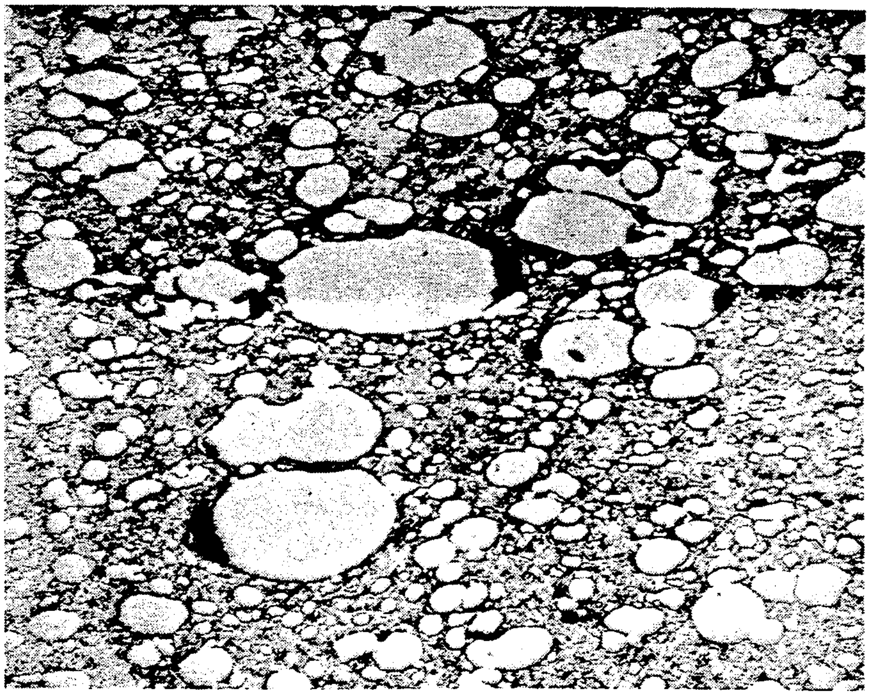
FIG. 4 is a photomicrograph of a longitudinal section of electrolytic copper/Alloy 42 rod shown in FIG. 3 extruded at 1450° F. according to Example X below.
Figure 8:
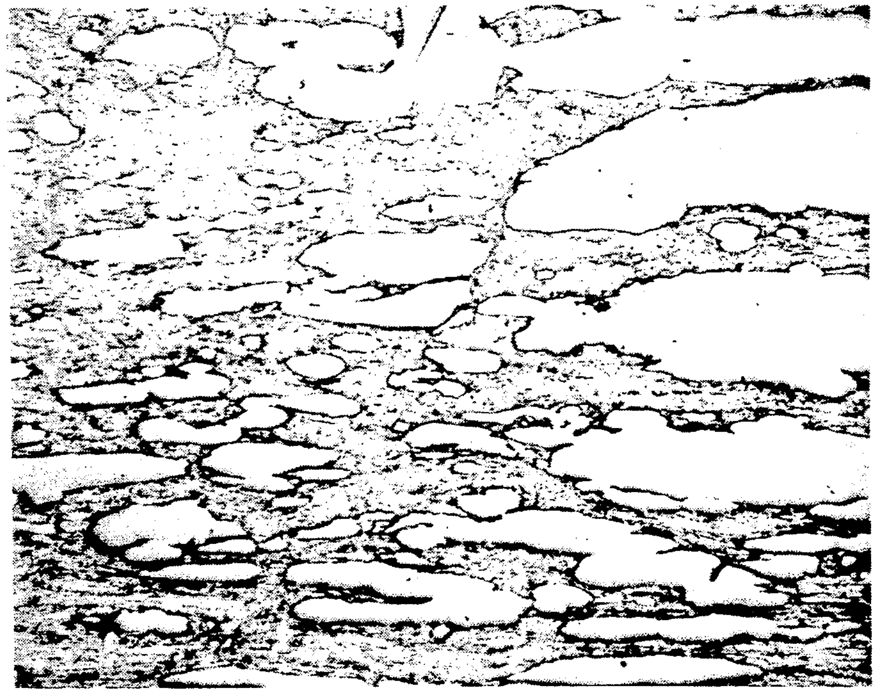
FIG. 8 is a photomicrograph of a longitudinal section of the rod in FIG. 7 extruded at 1450° F. according to Example XI below.

FIGS. 4 and 8 also illustrate the same phenomenon as described above. FIG. 4 is plain copper and FIG. 8 is DSC. Note that in FIG. 4 the additive metal alloy particles (light gray) are substantially deformed. Hence, their surface areas have not changed. In FIG. 8 there is substantial deformation and fiberizing of the additive metal alloy. This increases the interfacial surface area and increases the opportunity for interdispersion of the respective components as above described.

Example I below represents one embodiment of our invention. It describes substantially fully densified composites of dispersion strengthened metal with additive materials having, as a predicate, a low coefficient of expansion. These materials are compacted with a dispersion strengthened metal, critically without sintering, and below sintering temperatures.

EXAMPLE I

Sixty-two grams of GlidCop AL 20 powder, screened to −80/+400 mesh fraction, were thoroughly mixed with 186 grams of −80/+400 mesh fraction of an Invar powder. The chemical composition of the Invar alloy powder was 42% nickel, 0.32% manganese, 0.01% carbon and the balance of iron. Mixing was carried out in a double cone blender for a period of 30 minutes. A welded copper extrusion can, measuring 1⅝" in diameter (O.D.)×2¼" in length, with a ¼" O.D.×½" long fill tube, was filled with the above powder mix. The fill tube opening of the billet can was then closed tightly. The powder filled billet was then heated in a nitrogen atmosphere furnace at a temperature of 1550° F. for 45 minutes, and then the hot billet was extruded in an extrusion press, using a rectangular cross-section die-insert. The cross-section of the extruded bar measured 0.50×0.188", with rounded corners, and the extrusion ration was 16:1. The extrusion die preheat temperature was 900°-50° F. The extrusion pressure was 45 tons/square inch. The extruded bar was cut up into 6" long pieces. One of these pieces was used for the measurement of electrical conductivity, using a Kelvin Bridge (Leeds & Northrup Model #4306). The other pieces were cold rolled to a thickness of 0.100" and annealed at this size, at a temperature of 1500° F. for 30 minutes in nitrogen atmosphere. These strips were then rolled to 0.01" and 0.02" gage strips. Some strips were annealed again at 1450° F. temperature for 30 minutes in nitrogen atmosphere. All strips were tensile tested by using ASTM specimen dimensions. The results are shown in Table 2 below.

EXAMPLE II

The process utilized here was essentially the same as in Example I, except that here the extrusion billet was filled with Invar (42% Ni) powder only. Two hundred and fifty grams of Invar powder having the same chemical composition and mesh fraction, as in Example I were used. No DSC or any other powder was mixed with it. The extruded bar consisted of an Invar core with a plain copper cladding, which was rolled down to 0.01" gage strip for determining the mechanical properties at that gage. Mechanical properties were measured on an extruded bar, as in Example I. The results of the tests are shown in Table 2 below.

EXAMPLE III

A 1½" diameter copper tube having a wall thickness of 0.065" was formed into a flat tube, by rolling, having dimensions of 2.0" wide×0.6" thick×12" in length. This tube was then filled with Invar powder (42% Ni) (−80/+400 mesh fraction) and the ends of the tube were closed. The tube was then cold-rolled to 0.30" in thickness, by taking 15% reduction per pass. At this point, the billet was heated in nitrogen atmosphere furnace at a temperature of 1600° F. and then hot-rolled, taking 25% to 20% reductions per pass. Four hot rolling passes were given to the billet, resulting in a thickness of 0.10". The strips were then cold rolled to 0.05" in thickness. Tensile tests were carried out at this gage. The data are shown in Table 2 below.

EXAMPLE IV

The process utilized here was essentially the same as in Example I, except that the extrusion billet can was filled with a 50—50 mixture of GlidCop AL 20 and Invar 42% Ni powders. One hundred and twenty five grams of each of these two types of powder having particle size of −80/+400 mesh were used. The extruded bar was rolled to 0.030" thick strip. Two specimens were tested for mechanical strength in the as-rolled or cold-worked condition and the other specimens were annealed at 1450° F. for 30 minutes in nitrogen atmosphere prior to tensile test. The results are shown in Table 2 below. Electrical conductivity was also measured for this bar, using the same technique as in Example I.

EXAMPLE V

Using the process described in Example I, substantially the same results were obtained when a tin-containing dispersion strengthened copper alloy (2% Sn, 0.2% Aluminum) is used in place of the GlidCop AL-20. Dispersion strengthened copper is present in these alloys in an amount ranging from 50% to 99% by weight. The extent of refractory metal oxide, e.g., alumina, calculated as the metal equivalent, e.g., aluminum, is in the range of 0.05% to 5%, preferably 0.1% to 0.65%. Such grades of DSC are referred to as GLIDCOP AL- 15, AL-20, AL-25 and AL-60, where the numbers are indicative of the amount of aluminum present (becoming an oxide) in the copper, i.e the percentage is simply determined by dividing the number by 100 (e.g., AL-60 contains 0.6 weight % aluminum metal). The aluminum oxide particles are typically submicroscopic. Suitable alloying metals include tin, zinc, tin/zinc mixtures, silicon, magnesium, beryllium, zirconium, silver, iron, nickel, phosphorus, samarium, and mixtures of two or more such elements. The alloys can be prepared by conventional melt techniques followed by conventional atomization technology, by uniformly blending powders of DSC and the alloying metal followed by diffusion treating to accomplish alloying and then densifying the alloy to form a dispersion strengthened copper alloy.

TABLE 2

DATA FROM EXAMPLES I THRU IV: STRIP SAMPLES

| Example # | Material | Metallurgical Condition | Gage | ksi U.T.S. | ksi Y.S. | % Elong. |
|---|---|---|---|---|---|---|
| I | Cladding-Copper (15%) | C.W.-90% | .010" | 123.8 | 119.2 | 3 |
| (Extruded) | Core-GlidCop (25%) | C.W.-84% | .030" | 101.6 | 96.4 | 4 |
| | Invar* (75%) | Annealed | .030" | 72.7 | 60.5 | 19 |
| II | Cladding-Copper (12%) | C.W.-80% | .018" | 105.3 | 98.3 | 3 |
| (Extruded) | Core-Invar* (100%) | Annealed | .018" | 75.0 | 39.8 | 28 |
| III | Cladding-Copper (24%) | C.W.-30% | .050" | 97.0 | 89.3 | 5 |
| (Packrollled) | Core-Invar* (100%) | Annealed | .050" | 60.0 | 32.2 | 32 |
| IV | Cladding-Copper (15%) | C.W.-84% | .030" | 93.4 | 89.2 | 4 |
| (Extruded) | Core-GlidCop (50%) | Annealed | .030" | 71.0 | 57.1 | 22 |
| | Invar* (50%) | | | | | |

Electrical conductivity of a sample from Example I was determined to be 39.3% IACS or 4.4 microhm-cm; for Example IV sample condictivity was 47% IACS or 3.7 microhm-cm.
*42% Ni, bal. iron and impurities Dispersion strengthened alloys of copper may be used herein in the same manner as shown in Examples I and V.

One embodiment of the instant invention, controlled thermal expansion composite wire, is can be used as a lead wire in incandescent light bulbs. A 75 watt light bulb made by General Electric was found to have a lead wire consisting of three different segments connected in series. The constituents of these elements and their dimensions are shown below and in Table 3. Table 3 also shows the electrical resistance of these three components. Because these components are in series, the total resistance is the sum of the resistances of the three components, which is 23617 microhms.

A 60 watt General Electric light bulb was found to have a lead wire system which was similar to the 75 watt bulb, except for a thinner GlidCop wire. The diameter of the GlidCop wire here was only 0.012" or 0.03048 cm. The resistance of the GlidCop component here is 10,103 microhms. Hence, the total resistance of the lead wire is 26,311 microhms. (These values do not take into account the resistances that may result from the welded joints).

A composite wire (e.g. lamp lead) made up of DSC and an Invar type alloy component would have a higher modulus of elasticity than DSC. The modulus of elasticity of DSC is $16\times10^6$ psi. Except for beryllium-copper alloys and high nickel containing copper alloys, other alloys of copper have modulus of elasticity not exceeding $17\times10^6$ psi.

TABLE 3

DIMENSIONS AND RESISTANCE OF VARIOUS COMPONENTS OF LEAD WIRES IN 75 WATT LIGHT BULB

| Component | Length (cm) | Diameter (cm) | Area of Cross-Section (cm2) | Resistivity Microhm-cm | Resistance Microhm |
|---|---|---|---|---|---|
| GlidCop (AL 20) | 3.80 | .0356 (.014") | .000995 | 1.95 | 7409 |
| Dumet | 1.31 | Total-.037 | .001075 | — | 9401* |
| | | Core-.033 | .000855 | 80.0 | (122573) |
| | | Clad Thickness-.002 | .000220 | 1.71 | (10182) |
| Copper | 2.89 | .0304 | .000726 | 1.71 | 6807 |

*Overall Resistance of dumet component is given by $\frac{\text{Rcore} \times \text{Rclad}}{\text{Rcore} + \text{Rclad}}$ The modulus of elasticity of Invar type alloys range from $24\times10^6$ to $29\times10^6$ psi. Because in the present composite systems the modulus of elasticity obeys the rule of mixtures, a system consisting of DSC and an Invar type alloy would typically have modulus of elasticity in the range of 20 to $26\times10^6$ psi, which is significantly higher than most copper alloys. The higher modulus of elasticity and the higher tensile strength of the composite over those of DSC alone, enables reduction of the diameter of the lamp lead wire provided that electrical conductivity of the lead wire is acceptable.

The lower thermal conductivity of the composite lead wire (both in the standard size of 0.014" dia. and smaller if permissible) reduces the rate of heat transfer from the filament to the bulb stem. This results in greater reduction of energy consumption rate of the light bulb for the same amount of light output.

Using the composite wire concept, two examples having comparable overall electrical resistance are shown below. In both of these examples copper clad lead wire having 0.015" diameter, with a core consisting of 70% by volume Invar (42% Ni) and 30% by volume GlidCop (AL 20) are considered. However, a higher GlidCop or DSC content such as 40% or 50%, or a thicker copper cladding can be utilized, which would permit the reduction of the composite wire diameter (from the 0.015" used in the examples), while keeping the overall resistance of the lead wire system in the acceptable range. In one case, the copper cladding's thickness is 0.00035". In the former case, replacement of the entire lead wire system with the composite wire is determined to be feasible, whereas in the latter case, only the GlidCop and dumet portions could be replaced to arrive at the same overall resistance.

Examples VI and VII illustrate the concept of using a composite wire made up of Invar and GlidCop for lamp lead wire. The actual proportions of the two main components may be adjusted to arrive at the most suitable composite. Because the tensile strength of Invar (42% Ni) is greater than that of GlidCop, no loss of strength is anticipated in these composites over regular all-GlidCop lead wires.

TABLE 4

MECHANICAL PROPERTIES OF COMPOSITES

| EXAMPLE | COMPOSITION | DIAMETER (INCHES) | ANNEAL TEMPERATURE (°F.) | U.T.S. (KSI) | ELONGATION % |
|---|---|---|---|---|---|
| VIII(a) | 75% AL-15 + 25% Nilvar | .014 | As Drawn | 112 | — |
| | | | 600 | 99 | — |
| | | | 1200 | 85 | 4 |
| | | | 100 | 78 | 9 |
| VIII(b) | 50% AL-15 + 50% Nilvar | .014 | As Drawn | 122 | — |
| | | | 600 | 109 | — |
| | | | 1200 | 90 | 2 |
| | | | 1800 | 72 | 7 |
| VIII(c) | 25% AL-15 + 75% Nilvar | .014 | As Drawn | 140 | — |
| | | | 600 | 122 | — |
| | | | 1200 | 91 | 1 |
| | | | 1800 | 66 | — |

EXAMPLE VI

EXAMPLE VI

Overall diameter of composite wire-.015" or .0381 cm.

| | | |
|---|---|---|
| Core | .013" in diameter | consisting of 70% Invar + 30% GlidCop (AL 20) |
| Cladding | .001" in thickness | copper |
| Length | 8.0 cm, for all three components. | |

Areas of cross section of various components:

| | |
|---|---|
| Core (Total) | .0008563 sq. cm. |
| Invar | .000599 sq. cm. |
| GlidCop | .0002573 sq. cm. |
| Copper Cladding | .0002838 sq. cm. |
| Resistance of GlidCop | = 60318 microhms |
| Resistance of Invar | = 1066667 microhms |
| Resistance of Copper | = 48203 microhms |
| Resistance of Core | = 57089 microhms |
| Resistance of Lead Wire | = 26135 microhms |

EXAMPLE VII

Overall diameter of composite wire .015" or .3814 cm
diameter of composite core .0143"or .03632 cm
cladding thickness .00035"or .00089 cm
The length of composite wire 5.11 cm
The balance of lead wire or 2.89 cm will be of copper having 0.15"(or .0381 cm) diameter.

| Component | Area of Cross-Section sq. cm | Resistivity microhm-cm | Resistan microhm |
|---|---|---|---|
| Invar (42% Ni) | .000725 | 80 | 563862 |
| GlidCop | .000311 | 1.94 | 31875 |
| Copper Cladding | .0001038 | 1.71 | 84157 |

-continued

| Component | Area of Cross-Section sq. cm | Resistivity microhm-cm | Resistan microhm |
|---|---|---|---|
| Copper Wire | .001140 | 1.71 | 4335 |

Resistance of Core-30169
Net Resistance of Composite Wire = 22207

Adding the resistance of copper wire, total resistance will be 26542 microhm.

EXAMPLE VIII

The consolidation process employed here was essentially the same as Example I, except the extrusion billet was filled with various mixtures of GlidCop Al-15 and Nilvar (36% Ni, bal. Fe) powders. A particle size of −20 mesh was used. The resulting billets were extruded through a round cross sectional die insert with a diameter of 0.250 inches for an extrusion ratio of 30:1. The rods then underwent a series of size reductions being 20% cross-sectional reduction per pass to a final 0.014 inch diameter wire. Specimens with a ten inch gauge length were mechanically tested in the as drawn condition and annealed condition using a nitrogen atmosphere. The results appear in Table 4.

EXAMPLE IX

This test illustrates the importance of using dispersion strengthened copper powder, as opposed to plain copper powder, in a powder blend with Nilvar (36% Ni) to form a low expansion composite. The comparison is based on one method of consolidation.

The test started by blending two 50/50 mixtures; one of GLIDCOP AL-15 with Nilvar, the other of plain copper with Nilvar. Both the copper powders were finer than 170 mesh before blending.

Each powder blend filled a two feet long copper tube 1.5 inches in outside diameter with a 0.032 inch wall thickness. Both rods were cold swaged to a 0.975 inch diameter, sintered for one hour at 1650° F. in nitrogen, and further cold swaged to a 0.465 inch diameter. All cross-sectional reductions occurred at room temperature.

Metallographic examination at the 0.465 inch diameter in the longitudinal direction showed that both rod achieved crack-free full density. However, the microstructures were different. In one rod the soft copper particles deformed more than the relatively harder Nilvar particles to leave fibers of copper surrounding a less elongated island of Nilvar. See FIGS. 1 and 4. The structural disparity between the constituents resulted from the mechanical disparity between the constituents.

In contrast, the GlidCop particles deformed about as much as the similarly hard Nilvar particles to produce laminae of GlidCop and Nilvar. See FIGS. 2 and 8. The structural parity between the constituents is believed to have resulted from the mechanical parity between the constituents.

When the rods were utilized for a 20% cross sectional reduction by drawing, the copper-containing rod failed. The GlidCop containing rod did not. This difference in workability is believed to be due to the mechanical, hence structural, parity between the constituents.

The following Examples X to XVII inclusive are to be read in conjunction with FIGS. 3 to 13 comparing composites of this invention with plain copper composites, with and without sintering.

EXAMPLE X

A fifty-fifty mixture of electrolytic copper (EC) powder and nickel/iron Alloy 42 powder wa blended for 30 minutes in a double-cone blender. The particle size distributions of the two types of powders are shown in Table 5. Two copper extrusion billet cans measuring 1.40" in diameter and 2.0" in length were filled with the blended mixture.

TABLE 5

PARTICLE SIZE DISTRIBUTIONS OF POWDERS USED IN EXAMPLES X THROUGH XV

| Powder Type | WEIGHT PERCENTAGE | | |
|---|---|---|---|
| Particle Size (Screen Mesh) | Electrolytic Copper | Alloy 42* | GlidCop AL 15 |
| >80 | 5 | 20.5 | 20.5 |
| 80-100 | 5 | 8.5 | 8.5 |
| 100-140 | 5 | 15.0 | 15.0 |
| 140-200 | 5 | 21.5 | 21.5 |
| 200-325 | 80.0 | 17.0 | 17.0 |
| <325 | 15.0 | 17.5 | 17.5 |

*40% Ni, bal. Fe

Figure 3:
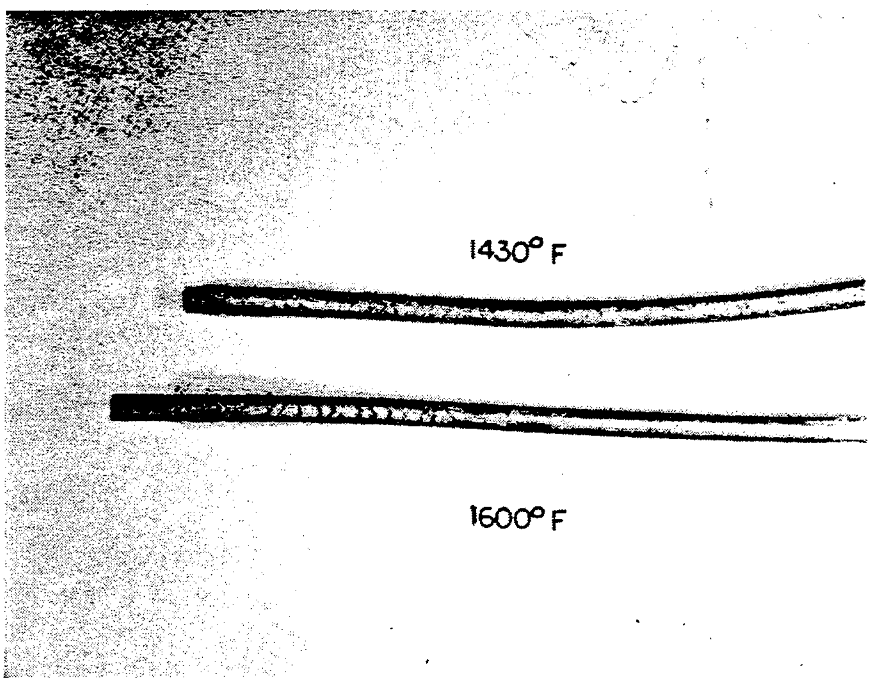
FIG. 3 is a photograph showing electrolytic copper-/Alloy 42 composite rods extruded at 1450° F. and 1600° F., respectively, according to Example X below.
Figure 5:
FIG. 5 and 6 show the condition of the rods extruded at 1450° F. and 1600° F. respectively, when it was attempted to draw into wire according to Example X below.
Figure 6:
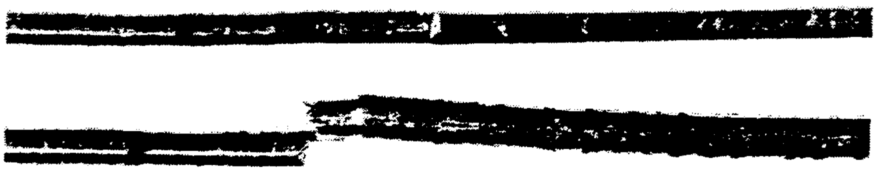

The two billet cans were hot extruded to 0.25" diameter round rods, after pre-heating at temperatures of 1450° F., respectively. The extrusion die temperature was 1000° F. for both. (It may be noted here that these two temperatures signify the practical upper and lower limits for hot extrusion of copper-base materials). The asextruded rods showed cracks as shown in FIG. 3. These cracks were transverse in nature and were severe enough to tear open the copper cladding. Metallographic examination of the longitudinal sections of the two rods showed that the Alloy 42 powder particles remained essentially undeformed during extrusion and voids were formed adjacent to these particles as the softer copper flowed around these. FIG. 4 is a photomicrograph of a longitudinal section of rod extruded at 1450° F. The 1600° F. extruded rod showed worse cracking than the 1450° F. extruded rod. Both rods were sent to an outside firm for wire drawing. Attempts to draw these were unsuccessful, as these rods broke under the tensile forces of the drawing operation in the very first drawing pass. FIGS. 5 and 6 show the condition of the rods after the wire drawing attempt.

EXAMPLE XI

Figure 7:
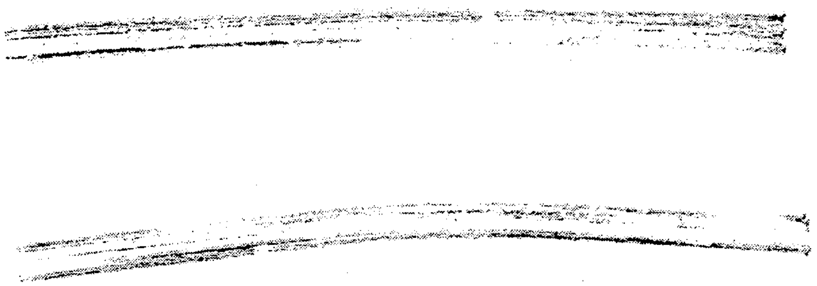
FIG. 7 is a photograph showing dispersion strengthened copper/Alloy 42 composite rods extruded at 1450° F. and 1600° F., respectively, according to Example XI below.
Figure 9:
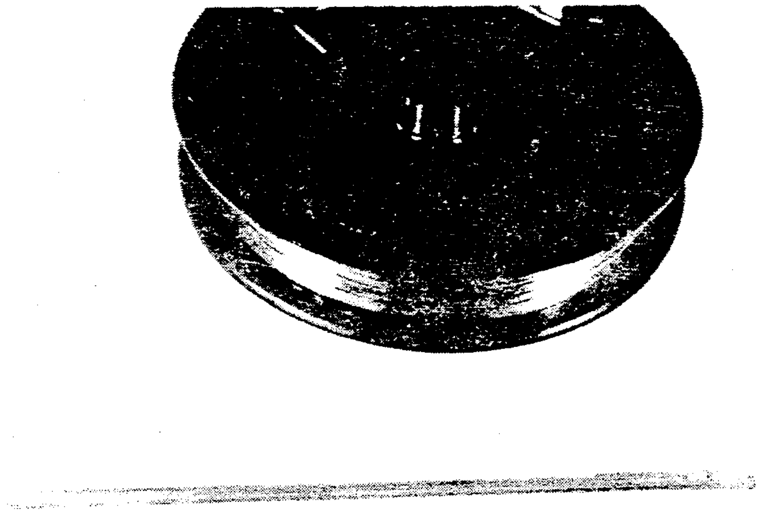
FIG. 9 is a photograph showing the rod of FIG. 8 after two drawing passes and showing the finished wire.

A fifty-fifty mixture of GlidCop (AL-15) powder and Alloy 42 was blended for 30 minutes in a double-cone blender. The particle size distributions of the two types of powders are shown in Table 5. Two copper extrusion billet cans measuring 1.40" in diameter and 2.0" in length were filled with the blended mixture. The two billet cans were hot extruded to 0.25" diameter round rods after pre-heating at temperatures of 1450° F. and 1600° F., respectively. The extrusion die temperature was 1000° F. for both. The as-extruded rods did not show any cracks, as shown in FIG. 7. Metallographic examination of longitudinal sections of the two rods showed that the Alloy 42 powder particles had undergone as much deformation as the GlidCop particles had and no voids were present in the material. FIG. 8 is a photomicrograph of a longitudinal section of the rod extruded at 1450° F. Both rods were sent to an outside firm for wire drawing. These were successfully drawn down to 0.010" diameter wires. FIG. 9 is a picture of the rod after two drawing passes and of the finished wire.

EXAMPLE XII

Figure 10:
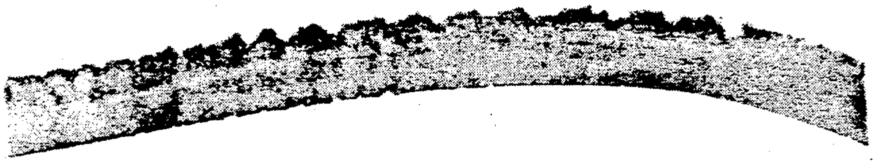
FIG. 10 is a photograph of an electrolytic copper/Alloy 42 composite after extruding to a rectangular rod, and attempting to cold roll according to Example IV below.

Here an extrusion was performed using the same powder mixture and the same process parameters as used in Example X, except that the extruded rod had a rectangular cross-section measuring 0.50"×0.125". Extrusion temperature was 1450° F. The as-extruded strip showed light cracks on the edges. The microstructure of the longitudinal section of the as-extruded stip was similar to FIG. 4. Attempts were made to cold roll the strip but edge cracks became severe when 0.043" thickness was reached and further rolling was not undertaken. FIG. 10 is a photograph of the strip at 0.043" thickness.

TABLE 6

PARTICLE SIZE DISTRIBUTIONS OF POWDERS USED IN EXAMPLES XVI AND XVII

| Powder Type | WEIGHT PERCENTAGE | | |
|---|---|---|---|
| Particle Size (Screen Mesh) | Electrolytic Copper | Alloy 36* | GlidCop AL 15 |
| 40-60 | — | 20.5 | 20.5 |
| 60-120 | — | 36.0 | 36.0 |
| (70-170) | 41.5 | — | — |
| 120-200 | — | 19.0 | 19.0 |
| 200-270 | — | 10.0 | 10.0 |
| (170-325) | 40.5 | — | — |
| 270-325 | — | 2.5 | 2.5 |
| <325 | 18.0 | 12.0 | 12.0 |

*36% Ni, bal. Fe

EXAMPLE XIII

Figure 11:
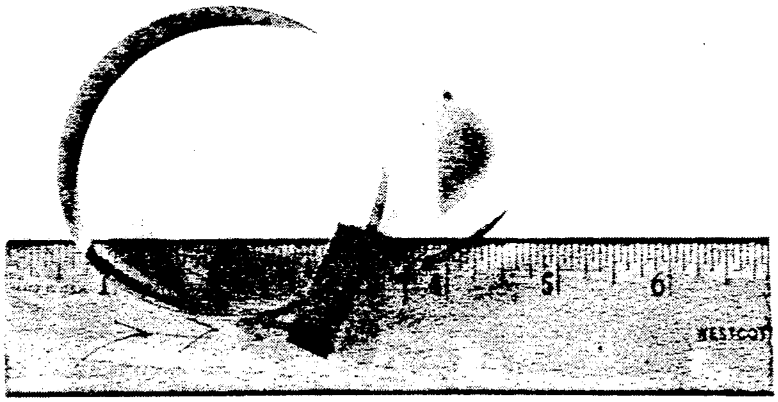
FIG. 11 is a photograph of a dispersion strengthened copper/Alloy 42 composite after extruding to a rectangular rod and cold rolling according to Example V below.

The process carried out here is similar to that in Example XII, except that GlidCop AL 15 powder was used here instead of electrolytic copper powder. The particle size distribution of the GlidCop powder is shown in Table 5. The extruded strip was sound in all respects and was rolled down to 0.010".in thickness. FIG. 11 is a photograph of a sample of the strip. The mechanical properties were determined, which are similar to those shown in Table 7, below.

EXAMPLE XIV

Figure 12:
FIG. 12 is a photograph of an electrolytic copper/Alloy 42 composite treated according to Example XIV below.

Electrolytic copper powder and Alloy 42 powder were blended in a ball mill for one hour. The particle size distributions of the two types of powder are shown in Table 5. The blended mixture was pressed into bars measuring 0.40" in thickness, using 99 ksi of pressure. The bars were sintered at 1850° F. for 3 minutes in hydrogen atmosphere. The bars were then rolled to 0.20" in thickness, taking 10% reduction per pass. The bars were resintered at the same temperature for 3 minutes in hydrogen atmosphere and then rolled to 0.1" thickness. The strip obtained was extremely brittle and had developed transverse cracks, mainly at the edges. FIG. 12 is a photograph of this strip.

TABLE 7

| MECHANICAL PROPERTY DATA EXAMPLES XVI AND XVII | | | | |
|---|---|---|---|---|
| Samples from | Condition | Ultimate Tensile Stress K.S.I. | Yield Stress K.S.I. | Elongation % |
| Example XVI | As Rolled | 111.6 | 105.0 | 4.4 |
| Example XVI | Annealed | 88.3 | 84.5 | 12.3 |
| Example XVII | As Rolled | 78.0 | 77.0 | 3.5 |
| Example XVII | Annealed | 50.5 | 33.2 | 10.6 |

EXAMPLE XV

Figure 13:
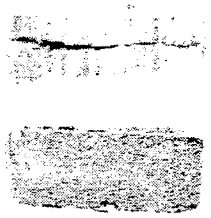
FIG. 13 is a photograph of a dispersion strengthen copper/Alloy 42 composite treated according to Example XV below.

Here the process followed and the process parameters used were identical to Example XIV, with the exception that GlidCop AL 15 powder was used instead of electrolytic or pure copper powder. The particle size distribution of GlidCop AL 15 powder was similar to the particle size distribution of the Alloy 42 powder. The pressed and sintered bars did not sinter well enough to permit rolling beyond two passes. FIG. 13 is a photograph of the bars.

EXAMPLE XVI

A fifty-fifty mixture of GlidCop AL 15 powder and Alloy 36 powder was blended in a double-cone blender for 30 minutes The particle size distribution for both powders are shown in Table 6. The mixture was pressed into 0.09" thick bars having a density of 92% of the full-theoretical density. The bars were then sintered at 1850° F. in nitrogen atmosphere for 40 minutes. These were then cold rolled by 50% and then resintered at 1800° F. for 40 minutes. Then they were rolled to 0.010" in thickness. Tensile tests were performed in the as-rolled condition and after annealing at 1600° F. for 30 minutes in nitrogen atmosphere. These results are shown in Table 7.

EXAMPLE XVII

The process followed and the process parameters used were identical to those used in Example XVI, except that electrolytic copper powder was used here instead of GlidCop AL 15. The particle size distribution of electrolytic copper is shown in Table 6 above. Pressed and sintered bars were rolled down to 0.010" and then tensile tested. The results are shown in Table 7.

The following four examples further emphasize the advantages of dispersion strengthened metal composites over plain metal composites, and illustrate the desirability of matching mechanical strengths of the two principal components in the final, unsintered composite. Plain copper powder mixed with Alloy 42 in a composite, for example, does not make a sound powder metallurgy (P/M) extrusion whereas aluminum oxide dispersion strengthened copper does. Plain copper powder when mixed with Alloy 36 does, however, make reasonably sound P/M extrusions. This is apparently due to the lower strength of Alloy 36 when compared to Alloy 41; i.e., the closer matching of strength properties does affect the product obtained. Rectangular cross-section extrusions made using a blend of plain copper powder and Alloy 36 did not show voids or cracks although the Alloy 36 particles did not deform as much as the particles of plain copper powder. The powder treatment procedure followed in these examples is as set forth in Example I.

EXAMPLE XVIII

Comparative low expansion composites following the procedure of Example I were made using the following compositions

| | | | |
|---|---|---|---|
| (A) | GlidCop Al 15 | (−200 mesh) | 50% by weight |
| | Alloy 36 | (−40 mesh) | 50% by weight |
| (B) | Electrolytic Copper | (−200 mesh) | 50% by weight |
| | Alloy 36 | (−40 mesh) | 50% by weight |

The mechanical properties of both samples hot swaged and both samples hot extruded are presented in Table 8 below. The columnar abbreviations have the following meanings: UTS = ultimate tensile strength. YS = yield strength. ΔA% = % reduction in area (a measure of ductility). ΔLS% = % elongation measured from specimen. $H_B$ is hardness measured on Rockwell 'B' scale. IACS is International Annealed Copper Standard (see Kirk-Othmer, Encyclopedia of Chemical Technology, Second Edition, Vol VI, Interscience Publishers, Inc. 1965, page 133). $\alpha \times 10^6/°C.$ is the coefficient of thermal expansion. This table shows that GlidCop composites have higher conductivity than copper composites illustrating more alloying in copper composites which lowers conductivity.

TABLE 8

COMPARISON OF DSC WITH PLAIN COPPER USING THE FOLLOWING COMPOSITIONS:

| | | | |
|---|---|---|---|
| (A) | Al-15 | (−200 mesh) | 50 wt. % |
| | Alloy 36 | (−40 mesh) | 50 wt. % |
| (B) | Elec. Cu | (−200 mesh) | 50 wt. % |
| | Alloy 36 | (−40 mesh) | 50 wt. % |

| CONDITION | MIX | UTS psi | YS psi | Δ A % | Δ LS % | $H_B$ | IACS % | $\alpha \times 10^6/°C.$ |
|---|---|---|---|---|---|---|---|---|
| As swaged | A* | 92,200 | 87,000 | 26,9 | 12.2 | 87 | — | — |
| 0.625" φ | B* | 81,000 | 74,900 | 32.8 | 14.0 | 76 | — | — |
| As drawn | A* | 103,200 | 98,40 | 37.2 | 12.7 | 85 | 15.0 | — |
| 0.244" φ | B* | 95,400 | 88,700 | 21.5 | 8.0 | 83 | 11.3 | |
| 0.244" φ | A* | 92,000 | 80,600 | 47.3 | 25.9 | 79 | — | — |
| Annealed | B* | 70,900 | 56,800 | 53.8 | 28.1 | 61 | — | — |
| (1200° F.) | | | | | | | | |
| As extruded | A** | 68,300 | 51,600 | 59.7 | 29.5 | 72 | 9.4 | 12.7 |
| 0.265" φ | B** | 63,100 | 46,900 | 64.0 | 28.4 | 56 | 6.3 | 13.9 |
| As drawn | A** | 124,000 | 119,300 | 21.2 | 2.5 | — | — | — |
| 0.014" φ | B** | 127,000 | 125,000 | 25.1 | 2.3 | — | — | — |
| 0.014" φ | A** | 88,300 | 73,800 | 22.5 | 8.1 | — | — | — |

TABLE 8-continued

| COMPARISON OF DSC WITH PLAIN COPPER USING THE FOLLOWING COMPOSITIONS: | | | | | | | | |
|---|---|---|---|---|---|---|---|---|
| Annealed (1200° F.) | B** | 81,600 | 72,100 | 37.4 | 3.5 | — | — | — |
| 0.014" 100 | A** | 73,600 | 62,800 | 51.5 | 11.7 | — | — | — |
| Annealed | B** | 65,700 | 54,700 | 65.4 | 15.4 | — | — | — |

*Hot Swaged
**Hot Extruded

EXAMPLE XIX

This example shows the results of our study of the effect of particle size and the presence or absence of cladding on extruded compositions in accordance with this invention. The compositions studied were as follows (all mesh sizes are U.S. Standard Screen sizes; the conductivities are set forth in Table 9 below):

| | | | |
|---|---|---|---|
| (C) | GlidCop AL-15 | (−200 mesh) | 50% by weight |
| | Alloy 36 | (−40 mesh) | 50% by weight |
| (D) | GlidCop AL-15 | (+200 mesh) | 50% by weight |
| | Alloy 36 | (+200 mesh) | 50% by weight |

TABLE 9

| COMPOSITION | MESH SIZE | CLADDING | % IACS |
|---|---|---|---|
| C | −200, −40 | NO | 9.4 |
| C | −200, −40 | YES | 22.0 |
| D | +200, +200 | NO | 15.0 |
| D | +200, +200 | YES | 30.8 |

Coarser particle size of the GlidCop AL-15 tends to reduce diffusion and give better conductivity. The presence of cladding also increases conductivity significantly.

Sample D also showed a UTS=65,000 psi, a YS of 50,000 psi; a A% of 60.7%; a LS% of 16.4% and a hardness of 68.8 $H_B$.

EXAMPLE XX

Comparative low expansion composites were made using the following compositions: The results are in Table 10.

| | | | |
|---|---|---|---|
| (E) | GlidCop AL-15 | (−200 mesh) | 50 vol. % |
| | Alloy 42 | (−40 mesh) | 50 vol. % |
| (F) | GlidCop AL-15 | (−20 mesh) | 50 vol. % |
| | Alloy 42 | (−20 mesh) | 50 vol. % |
| (G) | GlidCop AL-15 | (−200 mesh) | 25 vol. % |
| | Alloy 42 | (−40 mesh) | 75 vol. % |
| (H) | GlidCop AL-15 | (−20 mesh) | 25 vol. % |
| | Alloy 42 | (−20 mesh) | 75 vol. % |

EXAMPLE XXI

The procedure of Example IV is followed substituting powdered molybdenum for the Invar. Good conductivity is obtained but the product is harder, dimensionally stable, and wear resistant.

EXAMPLE XXII

The procedure of Example IV is followed substituting powdered tungsten for the Invar. Good conductivity is obtained, but the product is harder, dimensionally stable, and highly wear resistant.

EXAMPLE XXIII

The procedure of Example IV is followed substituting powdered Kovar (analysis above) for the Invar. Good conductivity is obtained, but the product is harder and dimensionally stable.

TABLE 10

| COMPOSITION | MESH SIZE | UTS (psi) | YS (psi) | ΔA % | ΔLS % | $H_B$ | IACS % |
|---|---|---|---|---|---|---|---|
| E | −200, −40 | 68700 | 55400 | 40 | 17.9 | 74.1 | 7.9 |
| F | −20, −20 | 66900 | 49200 | 47.3 | 30.0 | 72.5 | 9.5 |
| G | −200, −40 | 67700 | 52100 | 40.2 | 18.4 | 72.5 | 4.8 |
| H | −20, −20 | 67200 | 50000 | 43.4 | 16.3 | 73.3 | 5.8 |

Note that while the mechanical strength properties remain fairly constant, elevating the alloy content causes some decrease in conductivity. Larger particle size improves conductivity without sacrificing strength.

The following three examples are all derived from following the procedures disclosed in U.S. Pat. No. 4,501,941 to Cherry, and show that the instant invention provides surprisingly superior composites.

EXAMPLE XXIV

(DSC with Chromium)

Using the procedure disclosed in Cherry (in his specification bridging Columns 2 and 3):

A supply of "GlidCop AL-60", −20 mesh, was reduced in a hydrogen atmosphere for one hour at 1600° F. to eliminate any cuprous oxide on the surface (common practice in powder metallurgy techniques to improve the metallurgical properties over the oxide containing product). This product was then screened to obtain a −400 mesh fraction. A supply of chromium powder was screened to obtain a −200 mesh fraction as provided at lines 63 and 64 Col. 2 of Cherry. GlidCop AL-60 was produced by internal oxidation of aluminum in a copper/aluminum alloy containing 0.6 wt. % aluminum metal in solution in the copper with a copper oxide oxidant. The resulting aluminum oxide particles are "submicroscopic".

The screened GlidCop AL-60 and screened chromium powders were blended thoroughly in a V-blender for a period of ½ hour. The blend was introduced into a suitable die for compacting into test bars, one set being 3.5" tensile bars and the other being transverse rupture strength bars. The powder was compacted under a pressure of 60 tons per square inch and then vacuum sintered at 1920° F. (1050° C.) for four hours as described by Cherry. The dies were well lubricated with zinc stearate.

Even though the dies were well lubricated, the specimens showed laminations which may imply poor green strength. The first set of specimens (1-6) that were sintered also melted to a small degree. It is believed that the furnace overshot the desired temperature of 1050° C. (1920° F.) briefly after the initial temperature rise. Samples 1-6 sintered to about 96% of full density as shown in Table 11 below.

A second set of specimens (Nos. 7-12) was produced using the same procedure as described in Cherry, with the proper temperature control. The laminations were less severe than in the previous cases (1-6) although there was chipping along the edges of the samples near the surface upon removal from the dies. Temperature control of the furnace was more accurate with this second set, in not overshooting the desired temperature of 1050° C., and no melting occurred. Samples 1-7 sintered to only about 90% of full density. This is characteristic of dispersion strengthened copper in that it does not undergo significant shrinkage or densification during sintering as evidenced by the small difference between green and sintered densities.

The unintentional melting of the first batch of specimens (Nos. 1-6) actually improved the material properties as shown in Table 12 over the properties obtained in the second set (Nos. 7-12) which was sintered in accordance with the teachings of Cherry. The first group of specimens (1-6) were not only more dense because of melting, but were also stronger, more ductile, and had higher electrical conductivities. All the tensile specimens failed in a brittle manner, and specimen three broke during light machining on the surface.

Best properties (strength and conductivity) are obtained when the part is consolidated without sintering to substantially full density AL-15 also produces a better combination of properties than AL-60.

In the foregoing discussion samples bars 1, 2, 3 and 7, 8 and 9 were tensile test bars. These bars were tested according to ASTM Procedure E-8. Sample bars 4, 5, and 6 and 10, 11 and 12 were transverse rupture strength test bars. However, bars 4, 5, 6, 10, 11 and 12 were used only to determine density by conventional metallurgical practice.

TABLE 11

Densities of Prepared, GlidCop-Cr Composite Material. All samples were made with 25 Weight % Cr.

| Specimen No. | GlidCop Grade | Processing Method | Green Density % to Full | Sintered or Consolidated Density % of Full |
|---|---|---|---|---|
| 4 | AL-60 | Press + sinter | 90.6 | 96.6 |
| 5 | AL-60 | Press + sinter | 89.2 | 96.1 |
| 6 | AL-60 | Press + sinter | 91.6 | 96.2 |
| 10 | AL-60 | Press + sinter | 89.1 | 90.7 |
| 11 | AL-60 | Press + sinter | 85.1 | 89.5 |
| 12 | AL-60 | Press + sinter | 89.0 | 90.6 |
| | AL-15 | HIP + extrude | — | 99.5 |
| | AL-15 | HIP | — | 100.0 |
| | AL-60 | HIP | — | 98.6 |

TABLE 12

Material Proerties of GlidCop-Cr Composites

| Specimen No. | GlidCop Grade | Processing Method | Tensile Strength (KSI) | % Elong. | Electrical Conductivity % IACS |
|---|---|---|---|---|---|
| 1 | AL-60 | Press + sinter | 30.8 | 5.0 | 35 |
| 2 | AL-60 | Press + sinter | 28.2 | 4.4 | 36 |
| 3 | AL-60 | Press + sinter | broke during surface preparation | | |
| 7 | AL-60 | Press + sinter | 27.0 | 1.8 | 31 |
| 8 | AL-60 | Press + sinter | 26.3 | 2.2 | 32 |
| 9 | AL-60 | Press + sinter | 24.7 | 1.3 | 30 |
| | AL-15 | HIP + Extrude | 71.2 | 5.2 | 46 |
| | AL-60* | HIP | 35.6 | 0.2 | 37 |
| | AL-60 | HIP | 50.9 | 0.3 | 39 |

*This sample was taken from the edge of the HIP'ed piece where the density was low.

It was found that when samples were pressed at the pressures recommended by Cherry, laminations developed. If one reduces the pressure to get rid of the laminations, the densities are lowered and the electrical conductivity along with them. In those samples where melting was avoided, the final density was lower and the electrical conductivity also went down. The purpose of Cherry, however, is to obtain higher conductivity. However, nowhere in the prior art of record, or in Cherry, is there any definition of what is meant by "higher conductivity" or high density.

It is apparent, however, that the chromium/dispersion strengthened copper composite as prepared by Cherry's teachings possesses laminations, rendering it unworkable as an electrical contact material (see, e.g. U.S. Pat. No. 4,315,777 at Col. 6, lines 5-15). However, when composites are formed in accordance with the instant invention, a fine, workable product is obtained.

EXAMPLE XXV

DSC with Molybdenum

The following test samples were prepared to demonstrate that other refractory metals (really all) can be utilized within the scope of the invention. The following test samples were prepared using 25% molybdenum (−325 mesh) and 75% dispersion strengthened copper (−400 mesh) as set forth in the following Tables.

TABLE 13

| Specimen No. | GlidCop Grade | Processing Method | Green Density % to Full | Sintered or Consolidated Density % of Full |
|---|---|---|---|---|
| Densities of GlidCop*/Mo Composite Materials. All samples were made with 25% by weight Molybdenum | | | | |
| 1 | AL-60 | Press + sinter | 85.3 | 87.3 |
| 2 | AL-60 | Press + sinter | 85.6 | 87.7 |
| 3 | AL-60 | Press + sinter | 87.1 | 86.8 |
| 4 | AL-60 | Press + sinter | 85.3 | — |
| | AL-15 | HIP | — | 99.8 |
| | AL-60 | HIP | — | 99.5 |

TABLE 14

| Specimen No. | GlidCop* Grade | Processing Method | Tensile Strength (KSI) | % Elongation |
|---|---|---|---|---|
| Mechanical Properties of GlidCop*/Mo Composites | | | | |
| 5 | AL-60 | Press + sinter | 23.3 | 0.5 |
| 6 | AL-60 | Press + sinter | 23.8 | 0.4 |
| A | AL-15 | HIP | 94.8 | 3.6 |
| B | AL-15 | HIP | 94.6 | 1.7 |
| C | AL-60 | HIP | 99.1 | 1.1 |
| D | AL-60 | HIP | 93.1 | 0.9 |

*GlidCop is a trademark of SCM Metal Products, Inc. Products so identified are dispersion strengthened copper with finely divided submicron particles of Aluminum Oxide uniformly dispersed through a copper matrix. The AL-(number) indicating alumina and the concentration thereof, AL-15 being 0.15% aluminum as alumina (0.30%) and AL-60 being 0.60% aluminum as alumina (1.1% alumina).

The powdered metals (dispersion strengthened copper and molybdenum as above described) were blended thoroughly in a V-blender for a period of about 0.5 hour. The blend was introduced into a suitable die for compacting into test bars, one set being 3.5" tensile bars and the other being transverse rupture strength bars. The powder was then compacted under a pressure of 60 tons per square inch and then vacuum sintered at 1920° F. (1050° C.) for four hours with nitrogen backfill. The dies were well lubricated with zinc stearate.

Laminations or surface cracks were observed on all of the as-pressed bars. These no doubt helped to decrease the measured densities in the sintered bars, because the laminations opened up more during sintering. The consolidated bars (Table 13) were all below 90% of theoretical. The poor densification also leads to poor strength and ductility, as shown in Table 14. The elongations are no more than 0.5%, and there are no indications of ductility on the fracture surfaces of the tensile bars.

In short, the pressing and sintering method of consolidation as outlined by Cherry is wholly inadequate for producing fully dense and strong composite materials using dispersion-strengthened copper, in comparison with the products of accordance with the instant invention.

Two sets of GlidCop/Mo composites were HIP'ed, one with GlidCop grade AL-15, the other with AL-60. The powders were prepared by ball milling three parts −100 mesh GlidCop with one part −325 mesh Mo for 48 hours in a laboratory jar mill. The milled powder was reduced for one hour at 1650° F. in hydrogen and blended. The powders were vibratory filled into 7.5"×3"×1" rectangular cans and hot out-gassed before sealing. The cans were HIP'ed for four hours at 1750° F. The densities (Table 13) of this material are close to theoretical, and the material appears quite sound on both macro and micro scales. The tensile strengths were quite high for as-Hip'ed material, and the elongations were higher for the AL-15-Mo material than for the AL-60-Mo material. The more substantial ductility of the AL-15 composite would make it a better choice for a practical composite material.

Like the previous example, best properties (strength and conductivity) are obtained when the part is consolidated to full or nearly full density. Similarly, sample bars 5 and 6 were tensile test bars and were tested according to ASTM Procedure E-8. Sample bars 1-4 were transverse rupture strength test bars and were used only to determine density by conventional metallurgical practice.

The poor results under Cherry were the same as the prior example; however when molybdenum/dispersion strengthened copper composites are formed in accordance with the instant invention, a fine, workable product is obtained.

EXAMPLE XXVI

DSC with Tungsten

The powder for the pressed and sintered material was prepared by blending reduced −400 mesh (three parts) AL-60 grade GlidCop with one part −325 mesh tungsten. The powder was filled into the die cavities and pressed at 60 tons per square inch. Three small rectangular bars (specimen nos. 1-3), commonly referred to as transverse rupture bars, were pressed in addition to two 3.5" tensile bars (specimen nos. 4 and 5). All but one (No. 3) of the bars were vacuum sintered at 1920° F. for four hours with a nitrogen backfill.

There were laminations, or surface cracks, on all of the as-pressed bars. These no doubt helped to decrease the measured densities in the sintered bars, because the laminations only opened up more during sintering, causing an increase in volume and lower measured density. The consolidated densities of these bars (Table 15) were all below 90% of theoretical full density. The poor densification also implies poor strength and ductility, as shown in Table 16. The elongations are no more than 0.9%, and there are no indications of ductile modes of failure on the fracture surfaces of the tensile bars.

In short, the pressing and sintering method of consolidation as outlined by Cherry is wholly inadequate for producing fully dense and strong composite materials using dispersion-strengthened copper with tungsten, in comparison with the products of the instant invention.

One billet of GlidCop-W composite was hot-isostatically pressed using GlidCop grade AL-15. The composite powder was prepared by ball-milling three parts −100 mesh AL-15 with one part −325 mesh W for 72 hours in a laboratory jar mill. The milled powder was reduced for one hour at 1650° F. in hydrogen and blended. The powder was vibratory filled into a 7.5″×3″×1″ rectangular steel can and hot out-gassed before sealing. The cans were HIPed for four hours at 1750° F. The density of this material is quite close to theoretical, and the material appears quite sound on both macro and micro scales. The tensile strengths are quite high for as-HIPed material, and the elongations are also substantial. The higher ductility of AL-15 makes it more suitable for processing such as HIPing.

TABLE 15

Densities of GlidCop-W composite material. All samples were prepared with 25 Weight % W.

| Specimen No. | GlidCop Grade | Processing Method | Density Green | % of theoretical Consolidated |
|---|---|---|---|---|
| 1 | AL-60 | Press + sinter | 87.0 | 87.4 |
| 2 | AL-60 | Press + sinter | 88.0 | 88.2 |
| 3 | AL-60 | Press + sinter | 88.2 | — |
| | AL-15 | HIP | — | 98.8 |

TABLE 16

Mechanical properties of GlidCop-W composites.

| Specimen No. | GlidCop Grade | Processing Method | Tensile Str. (psi) | % Elongation |
|---|---|---|---|---|
| 4 | AL-60 | Press + sinter | 11,900 | 0.9 |
| 5 | AL-60 | Press + sinter | 12,400 | 0.8 |
| 6 | AL-15 | HIP | 92,000 | 4.1 |
| 7 | AL-15 | HIP | 91,900 | 3.0 |

Like the foregoing examples, samples pressed at the pressures recommended by Cherry, possess laminations, or at backed off pressure, the densities and conductivity are lowered. Thus, the tungsten/dispersion strengthened copper composites prepared under Cherry's teachings are unworkable, and composites formed in accordance with the instant invention are workable.

Dispersion strengthened metals, e.g., copper, aluminum or silver based composites, combined with specific additive metals, alloys or compounds, combine the high electrical and thermal conductivities of the dispersion strengthened metal with other useful characteristics of one or more of the additive constituents. The following are some examples:

(1) Controlled Thermal Expansion Composites

Dispersion strengthened metal, e.g., copper, aluminum or silver plus expansion constituents such as Ni-Fe alloys, Kovar (Fe-28% Ni-18% Co), tungsten, molybdenum, niobium, tantalum, rhenium, chromium, tungsten-rhenium, tungsten-nickel-iron and tungsten-carbide, etc. having low thermal expansion coefficients.

Here the objective is to make a composite with a coefficient of expansion that matches a glass or a ceramic with which it is sealed.

End Uses (a) Glass to metal seals—incandescent lamp leads, hermetically sealed connectors, (b) Integrated circuit lead frames, Kovar replaces some of the Ni in Ni-Fe alloys with cobalt. This reduces nickel and reduces the diffusion into GlidCop. Cobalt has a lower solid solubility in copper with a similar diffusion coefficient as nickel. The loss in conductivity is less than with Ni-Fe alloys. Additionally, the thermal expansion coefficient of Kovar over the range of 20° C.-415° C. (Setting point for soda lime glass) is lower than that of Ni-Fe alloys. Kovar has a thermal coefficient of expansion similar to tungsten in this temperature range but bonding is expected to be easier. Loss in conductivity will be greater than with tungsten.

(2) High Strength Composite

Dispersion strengthened metal, e.g., copper, aluminum or silver plus high strength constituents such a high strength steels (maraging steels, stainless steels, music wire, etc.), tungsten, molybdenum, niobium, tantalum, as well as graphite fibers, silicon whiskers, boron and silicon nitride fibers.

Here the objective is to make a composite with strength comparable to Cu-Be alloys with spring properties equivalent or superior to the latter. Electrical conductivity higher than Cu-Be alloys is also desirable.

End Uses (a) Electrical and electronic connectors,
(b) Current carrying springs,
(c) Switch components,
(d) High strength sleeve bearings,
(e) Circuit breakers.

Wear Resistant Composite

Dispersion strengthened metal, e.g., copper, aluminum or silver plus tungsten, tungsten carbide, molybdenum, niobium, tantalum, rhenium, chromium, tungsten-rhenium, and tungsten-nickel-iron.

Here the objective is to make a composite with high hardness and wear resistance.

End Uses (a) Electrical contacts,
(b) Resistance welding electrodes,
(c) MIG welding tips,
(d) Hazelett caster side dam blocks,
(e) Die casting plunger tips,
(f) Plastic injection molding tools,
(g) Commutators,
(h) Continuous or DC casting molds.

(4) Magnetic Composite

Dispersion strengthened metal, e.g., copper, aluminum or silver, plus an additive having a magnetic component such as steel, iron, nickel, cobalt, iron-nickel, cobalt-samarium.

Here the objective is to make a composite having high conductivity with superior high temperature softening resistance and also having magnetic characteristics which enable handling of components on automated equipment.

End Uses (a) Discrete component or axial (diode) leads, (b) Rotors for X-ray tube anodes.

It is to be understood that the scope of the invention is by no means merely limited to the specific embodiments, examples, materials, or parameters used, but includes equivalents to the fullest extent.

What is claimed is:

1. A substantially fully dense compacted and unsintered powdered metal composite, comprising: (a) a metal or metal alloy matrix having uniformly dispersed therein discrete microparticles of a refractory metal oxide and (b) discrete macroparticles of an additive material.

2. The composite of claim 1 wherein the additive material is a metal, metal alloy or metal compound having a low thermal expansion coefficient.

3. The composite of claim 2 wherein the metal, metal alloy or metal compound is selected from the group consisting of tungsten, molybdenum, niobium, tantalum, rhenium, chromium, tungsten-rhenium, tungsten-nickel-iron, nickel-iron, nickel-iron-cobalt and tungsten-carbide.

4. The composite of claim 1 wherein the additive material is a metal, metal alloy or metal compound having high strength.

5. The composite of claim 4 wherein the metal, metal alloy or metal compound is selected from the group consisting of tungsten, molybdenum, niobium, tantalum, music wire and high alloy steels.

6. The composite of claim 1 wherein the additive material is selected from the group consisting of graphite fibers, silicon whiskers, boron and silicon nitride fibers.

7. The composite of claim 1 wherein the additive material is a metal, metal alloy or metal compound having high hardness and high wear and arc erosion resistance.

8. The composite of claim 7 wherein the additive metal, metal alloy or metal compound is selected from the group consisting of tungsten, molybdenum, niobium, tantalum, rhenium, chromium, tungsten-rhenium, tungsten-carbide and tungsten-nickel-iron.

9. The composite of claim 1 wherein the additive material is a metal, metal alloy or metal compound having magnetic properties.

10. The composite of claim 9 wherein the additive metal, metal alloy or metal compound is selected from the group consisting of iron, nickel, cobalt, steels, iron-nickel and cobalt-samarium.

11. The composite of claim 1, wherein said components (a) and (b) are substantially nonalloyed.

12. The composite of claim 1, wherein said components (a) and (b) are substantially noninterdiffused.

13. The composite of claim 1, wherein said matrix is a dispersion strengthened metal having an electrical resistivity below about $8\times10^{-6}$ ohm-cm.

14. The composite of claim 1, wherein said matrix is dispersion strengthened copper.

15. The composite of claim 1, wherein said matrix is dispersion strengthened copper, and said refractory metal oxide is aluminum oxide.

16. The composite of claim 1, wherein said additive material is a refractory metal, refractory metal alloy, or refractory metal compound selected from the group consisting of tungsten, molybdenum, niobium, tantalum and rhenium.

17. A substantially fully dense compacted and unsintered powdered metal composite, comprising: (a) a metal or metal alloy matrix having uniformly dispersed therein discrete microparticles of a refractory metal oxide and (b) discrete macroparticles of a refractory metal, refractory metal alloy or refractory metal compound selected to thereby impart to the composite a controlled coefficient of expansion.

18. The composite of claim 17, wherein said components (a) and (b) are substantially nonalloyed.

19. The composite of claim 17, wherein said components (a) and (b) are substantially noninterdiffused.

20. The composite of claim 17, wherein said matrix is a dispersion strengthened metal having an electrical resistivity below about $8\times10^{-6}$ ohm-cm.

21. A substantially fully dense compacted and unsintered powdered metal composite, comprising: (a) a metal or metal alloy matrix having uniformly dispersed therein discrete microparticles of a refractory metal oxide and (b) discrete macroparticles of a refractory metal, refractory metal alloy or refractory metal compound selected to thereby impart to the composite a high strength.

22. The composite of claim 21, wherein said components (a) and (b) are substantially nonalloyed.

23. The composite of claim 21, wherein said components (a) and (b) are substantially noninterdiffused.

24. The composite of claim 21, wherein said matrix is a dispersion strengthened metal having an electrical resistivity below $8\times10^{-6}$ ohm-cm.

25. The composite of claim 21, wherein said matrix is dispersion strengthened copper.

26. The composite of claim 21, wherein said matrix is dispersion strengthened copper, and said refractory metal oxide is aluminum oxide.

27. The composite of claim 21, wherein said refractory metal, or at least one element of said refractory metal alloy, or refractory metal compound is selected from the group consisting of tungsten, molybdenum, chromium, niobium, rhenium, tantalum and tungsten-carbide.

28. A substantially fully dense compacted and unsintered powdered metal composite, comprising: (a) a metal or metal alloy matrix having uniformly dispersed therein discrete microparticles of a refractory metal oxide and (b) discrete macroparticles of a refractory metal, refractory metal alloy or refractory metal compound selected to thereby impart to the composite a high wear resistance.

29. The composite of claim 28, wherein said components (a) and (b) are substantially nonalloyed.

30. The composite of claim 28, wherein said components (a) and (b) are substantially noninterdiffused.

31. The composite of claim 28, wherein said matrix is a dispersion strengthened metal having an electrical resistivity below $8\times10^{-6}$ ohm-cm.

32. The composite of claim 28, wherein said matrix is dispersion strengthened copper.

33. The composite of claim 28, wherein said matrix is dispersion strengthened copper, and said refractory metal oxide is aluminum oxide.

34. The composite of claim 28, wherein said refractory metal, or at least one element of said refractory metal alloy, or refractory metal compound is selected from the group consisting of tungsten, molybdenum, and chromium, niobium, rhenium, tantalum and tungsten-carbide.

35. A substantially fully dense compacted and unsintered powdered metal composite, comprising: (a) a metal or metal alloy matrix having uniformly dispersed therein discrete microparticles of a refractory metal oxide and (b) discrete macroparticles of a mechanical or physical property-conferring material having mechanical or physical parity with component (a).

36. The composite of claim 35, wherein said components (a) and (b) are substantially nonalloyed.

37. The composite of claim 35, wherein said components (a) and (b) are substantially noninterdiffused.

38. The composite of claim 35, wherein said matrix is a dispersion strengthened metal having an electrical resistivity below $8\times10^{-6}$ ohm-cm.

39. The composite of claim 35, wherein said matrix is dispersion strengthened copper.

40. The composite of claim 35, wherein said matrix is dispersion strengthened copper, and said refractory metal oxide is aluminum oxide.

41. The composite of claim 35, wherein component (b) is a refractory metal, refractory metal alloy or refractory metal compound.

42. The composite of claim 35, wherein said refractory metal, or at least one element of said refractory metal alloy, or at refractory metal compound is selected from the group consisting of tungsten, molybdenum, and chromium.

43. A process for forming a substantially fully dense compacted and unsintered powdered metal composite, comprising compacting without sintering: (a) a metal or metal alloy matrix having uniformly dispersed therein discrete microparticles of a refractory metal oxide and (b) discrete macroparticles of a mechanical or physical property-conferring material having mechanical or physical parity with component (a).

44. The process of claim 43, wherein said components (a) and (b) are substantially nonalloyed.

45. The composite of claim 43, wherein said components (a) and (b) are substantially noninterdiffused.

46. The composite of claim 43, wherein said matrix is a dispersion strengthened metal having an electrical resistivity below $8\times10^{-6}$ ohm-cm.

47. The composite of claim 43, wherein said matrix is dispersion strengthened copper.

48. The composite of claim 43, wherein said matrix is dispersion strengthened copper, and said refractory metal oxide is aluminum oxide.

49. The composite of claim 43, wherein component (b) is a refractory metal, refractory metal alloy or refractory metal compound.

50. The composite of claim 43, wherein said refractory metal, or at least one element of said refractory metal alloy, or at refractory metal compound is selected from the group consisting of tungsten, molybdenum, chromium, niobium, rhenium, tantalum and tungsten-carbide.

51. The composite of claim 1 wherein the additive material is a superconductor.

52. The composite of claim 2 wherein the material is selected from the group consisting of niobium-tin, niobium-titanium and copper-barium-yttrium oxide.

53. A substantially fully dense compacted and unsintered powdered metal composite as described in claim 1 wherein component (a) is dispersion strengthened copper and the additive material is niobium.

* * * * *